(12) United States Patent
Akaike et al.

(10) Patent No.: US 11,226,366 B2
(45) Date of Patent: Jan. 18, 2022

(54) WAFER INSPECTION DEVICE AND MAINTENANCE METHOD FOR SAME

(71) Applicant: TOKYO ELECTRON LIMITED, Tokyo (JP)

(72) Inventors: Yutaka Akaike, Nirasaki (JP); Takeo Saito, Nirasaki (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 580 days.

(21) Appl. No.: 16/061,784

(22) PCT Filed: Oct. 14, 2016

(86) PCT No.: PCT/JP2016/081189
§ 371 (c)(1),
(2) Date: Jun. 13, 2018

(87) PCT Pub. No.: WO2017/104262
PCT Pub. Date: Jun. 22, 2017

(65) Prior Publication Data
US 2018/0364300 A1 Dec. 20, 2018

(30) Foreign Application Priority Data
Dec. 17, 2015 (JP) .............................. JP2015-246180

(51) Int. Cl.
*G01R 31/28* (2006.01)
*G01R 31/26* (2020.01)
(Continued)

(52) U.S. Cl.
CPC ............ *G01R 31/2886* (2013.01); *B24B 1/00* (2013.01); *G01R 31/26* (2013.01); *G01R 31/28* (2013.01); *H01L 21/6838* (2013.01)

(58) Field of Classification Search
CPC .. G01R 31/2886; G01R 331/26; G01R 31/28; B24B 1/00; H01L 21/6838
See application file for complete search history.

(56) References Cited

U.S. PATENT DOCUMENTS

| | | | |
|---|---|---|---|
| 8,587,331 B2* | 11/2013 | Berry ................. | G01R 31/2891 324/750.16 |
| 2014/0331421 A1* | 11/2014 | Broz ....................... | B24B 19/16 15/104.93 |
| 2015/0130489 A1* | 5/2015 | Yamada ............. | G01R 1/06705 324/754.11 |

FOREIGN PATENT DOCUMENTS

| JP | H11-54574 A | 2/1999 |
|---|---|---|
| JP | 2014-29917 A | 2/2014 |

OTHER PUBLICATIONS

International Search Report dated Jan. 17, 2017 issued in corresponding International Application No. PCT/JP2016/081189.

* cited by examiner

*Primary Examiner* — Joseph J Hail
*Assistant Examiner* — J Stephen Taylor
(74) *Attorney, Agent, or Firm* — Nath, Goldberg & Meyer; Jerald L. Meyer; Tanya E. Harkins

(57) ABSTRACT

There is provided a wafer inspection device that is capable of bringing a polishing wafer into proper contact with probes without lowering throughput. The total value T of a thickness $t_1$ of a polishing plate, a thickness $t_2$ of a polishing wafer and a magnitude $t_3$ extending from a lower surface of a main body of a pogo frame to a lower end of each probe of a probe card is set to be larger than a magnitude $t_4$ of a lip seal protruding from an upper surface of a chuck top.

6 Claims, 6 Drawing Sheets

(51) Int. Cl.
*B24B 1/00* (2006.01)
*H01L 21/683* (2006.01)

WAFER INSPECTION DEVICE AND MAINTENANCE METHOD FOR SAME

This is a National Phase Application filed under 35 U.S.C. 371 as a national stage of PCT/JP2016/081189, filed Oct. 14, 2016, an application claiming the benefit of Japanese Application No. 2015-246180, filed Dec. 17, 2015, the content of each of which is hereby incorporated by reference in its entirety.

TECHNICAL FIELD

The present disclosure relates to a wafer inspection device for polishing needle-shaped probes of a probe card for wafer inspection, and a maintenance method for the same.

BACKGROUND

A prober is used as an inspection device for inspecting a wafer on which a large number of semiconductor devices are formed. The prober includes a probe card which faces the wafer. The probe card includes probes that are a plurality of needle-shaped contact terminals arranged so as to face electrode pads and solder bumps of the semiconductor devices on the wafer. The prober vacuum-attracts the wafer such that the wafer is pressed against the probe card. Thus, the probes of the probe card are brought into contact with the electrode pads and the solder bumps in the semiconductor devices (see, e.g., Patent Document 1). At this time, electricity flows from the probes to electric circuits of the semiconductor devices connected to the electrode pads and the solder bumps. Thus, electrical characteristics of the semiconductor devices are inspected.

However, since the wafer has low rigidity, when only the wafer is vacuum-attracted onto the probe card, the wafer may be warped so that the electrode pads or the solder bumps cannot make uniform contact with the probes of the probe card. In view of this, a technique has been proposed to vacuum-attract a chuck top, which is a thick plate member on which a wafer is mounted, together with the wafer, onto a probe card, thereby suppressing warpage of the wafer by the chuck top. Specifically, as illustrated in FIG. 7A, a wafer W mounted on a chuck top 72 is disposed to face a probe card 71 that is attached to a pogo frame 70 serving as a base member. A lip seal 73, which is an elastic sealing member, projects from the chuck top 72 toward the pogo frame 70. Thereafter, the chuck top 72 is moved toward the pogo frame 70 to bring the lip seal 73 into contact with the pogo frame 70. Thus, a space S defined between the chuck top 72 and the pogo frame 70 is hermetically sealed. After the wafer W is pressed against the probe card 71, the space S is depressurized so that the wafer W, together with the chuck top 72, is pulled toward the pogo frame 70. Thus, the state of bringing the wafer W into contact with the probe card 71 is maintained. At this time, the lip seal 73 is compressed (see FIG. 7B).

However, when the inspection of the wafer W using the probe card 71 is repeated, the contact between the electrode pads or the solder bumps and the probes 74 of the probe card 71 is also repeated. This wears out the probes 74. Therefore, there is a need to periodically polish each of the probes 74. The polishing of the probes 74 is performed by bringing a polishing wafer into contact with the probes 74.

PRIOR ART DOCUMENTS

Patent Documents

Patent Document 1: Japanese laid-open publication No. 2014-29917

However, in the method of pressing the wafer W against the probe card 71 using the above-described chuck top 72, when the chuck top 72 on which a polishing wafer 75 is mounted is moved toward the pogo frame 70 the lip seal 73 is brought into contact with the pogo frame 70 to form the space S between the chuck top 72 and the pogo frame 70 before the polishing wafer 75 is brought into contact with the probes 74 (see FIG. 7C). Thereafter, the chuck top 72 is further moved toward the pogo frame 70. As a result, an internal pressure of the space S is increased so that a repulsion force acting on the chuck top 72 is generated. This may cause a problem such that the polishing wafer 75 is not brought into contact with the probes 74 in a proper manner.

It is conceivable to depressurize the space S in order to prevent the internal pressure of the space S from increasing. However, such a method takes some time. It is also conceivable to mitigate the increase of the internal pressure of the space S by easing the rise of the internal pressure of the space S so that the polishing wafer 75 can make proper contact with the probes 74. However, this method has a need to move the chuck top 72 toward the pogo frame 70 at a low speed. That is to say, the method results in low throughput.

SUMMARY

The present disclosure provides some embodiments of a wafer inspection device and a maintenance method for the same that can bring a polishing wafer into proper contact with probes without resulting in low throughput.

According to one embodiment of the present disclosure, there is provided a wafer inspection device including a probe card having a plurality of contact terminals formed to protrude toward a wafer, a chuck top as a thick plate member on which the wafer is mounted to face the probe card, and a seal member configured to seal a space between the probe card and the chuck top when the chuck top moves toward the probe card, including: a raising member placed on the chuck top and configured to mount a polishing wafer thereon, the polishing wafer being configured to polish the plurality of contact terminals, wherein the raising member has a thickness such that, when the chuck top moves toward the probe card, the polishing wafer is brought into contact with each of the plurality of contact terminals before the space is sealed by the seal member.

According to another embodiment of the present disclosure, there is provided a maintenance method of a wafer inspection device including a probe card having a plurality of contact terminals formed to protrude toward a wafer, a chuck top as a thick plate member on which the wafer is mounted to face the probe card, and a seal member configured to seal a space between the probe card and the chuck top when the chuck top moves toward the probe card, the method including: placing a raising member on the chuck top and mounting a polishing wafer, which is configured to polish the plurality of contact terminals, on the raising member; and moving the chuck top toward the probe card, wherein the raising member has a thickness such that, when the chuck top moves toward the probe card, the polishing wafer is brought into contact with each of the plurality of contact terminals before the space is sealed by the seal member.

According to the present disclosure, a raising member is interposed between a wafer and a chuck top. A polishing wafer for polishing contact terminals is mounted on the raising member. The raising member has a thickness such that, when the chuck top moves toward a probe card, the polishing wafer is brought into contact with each contact terminal before a seal seals a space. Thus, the polishing wafer is brought into contact with each contact terminal before the space is sealed. That is to say, no repulsion force acts on the chuck top before bringing the polishing wafer into contact with each contact terminal, which makes it possible to bring the polishing wafer into proper contact with each contact terminal. In addition, since there is no need to take into consideration the decompression of the space and the mitigation of the increase of the internal pressure of the space, it is unnecessary to perform a decompression step or move the chuck top toward the probe card at a low speed, thereby preventing a reduction in throughput.

DETAILED DESCRIPTION

Embodiments of the present disclosure will now be described below in detail with reference to the accompanying drawings.

Figure 1:
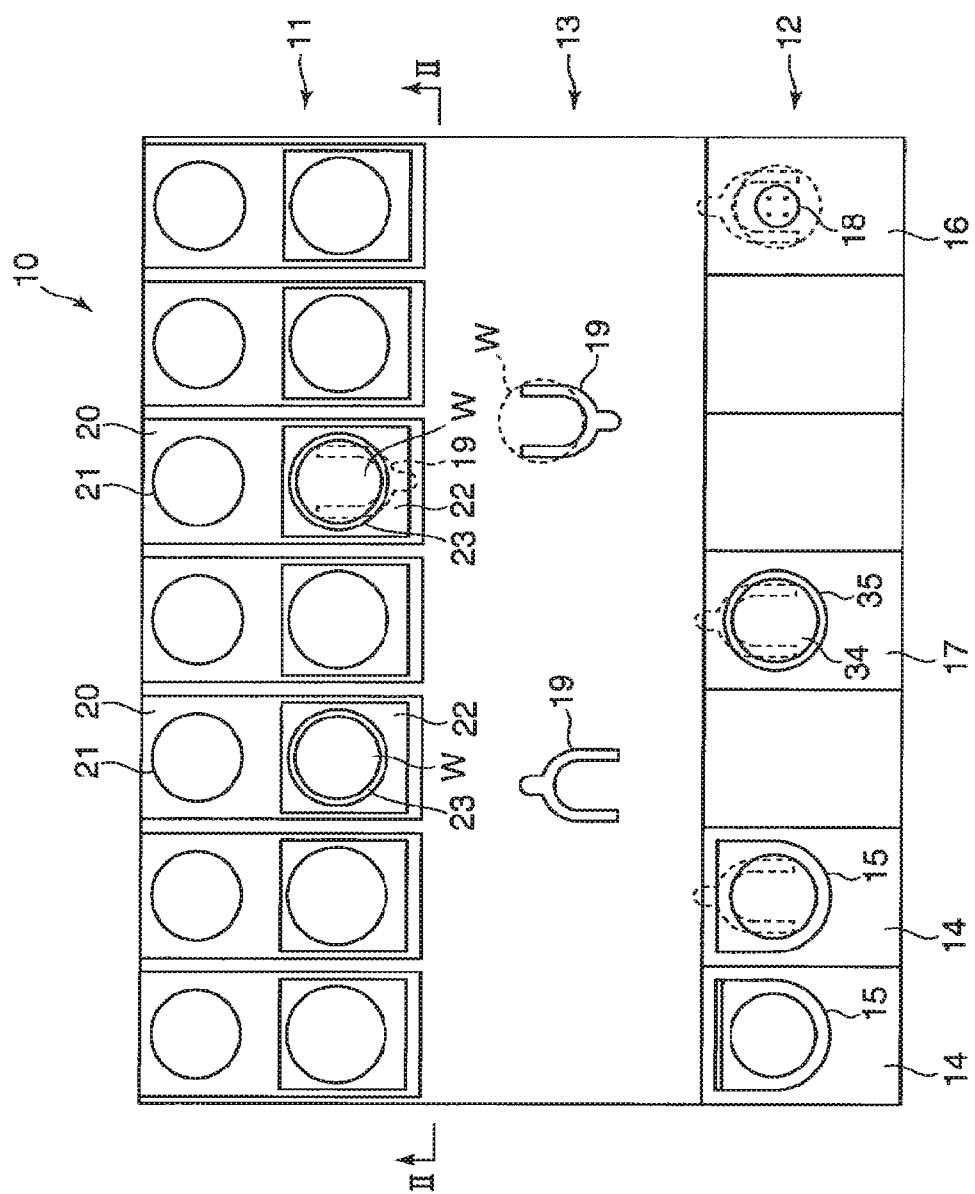
FIG. 1 is a plan view schematically illustrating a configuration of a wafer inspection device according to an embodiment of the present disclosure.
Figure 2:
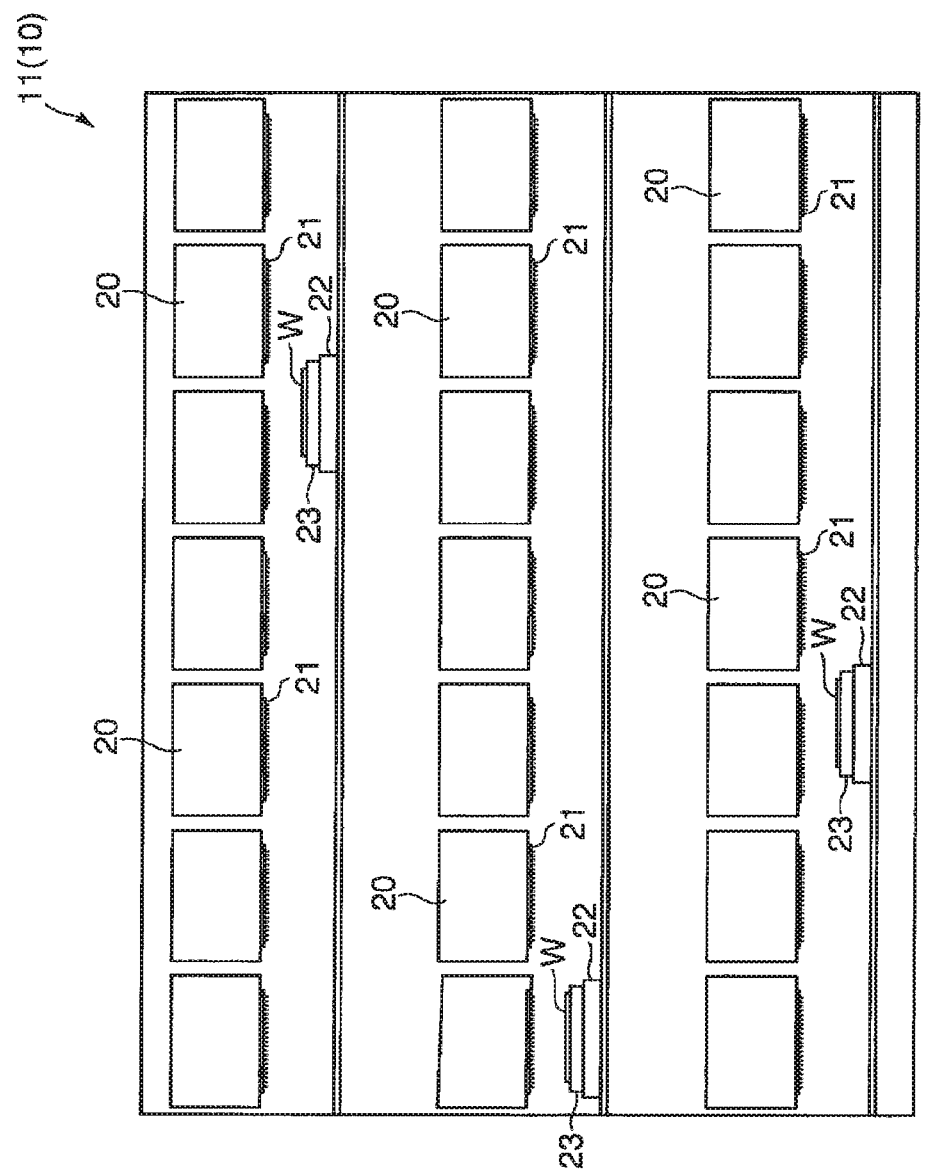
FIG. 2 is a sectional view taken along line II-II in FIG. 1.

FIG. 1 is a plan view schematically illustrating a configuration of a wafer inspection device according to an embodiment of the present disclosure and FIG. 2 is a sectional view taken along line II-II in FIG. 1. For the sake of easier understanding, an internal configuration of the wafer inspection device is shown in a see-through manner in FIG. 1. The wafer inspection device according to the present embodiment is a whole contact type wafer inspection device which inspects electrical characteristics of semiconductor devices formed on a wafer by bringing all probes of a probe card into contact with all electrode pads and solder bumps of the semiconductor devices at one time.

Referring to FIG. 1, a wafer inspection device 10 includes an inspection region 11 where the electrical characteristics of semiconductor devices formed on a wafer W are inspected, a loading/unloading region 12 where the wafer W, a polishing wafer 34, a probe card 21 (which will be described later) or the like is loaded into and unloaded from the wafer inspection device 10, and a transfer region 13 interposed between the loading/unloading region 12 and the inspection region 11 to transfer the wafer W and the like therethrough.

Loading/unloading cells 14 are arranged in the loading/unloading region 12. A receiving mechanism (not shown) for a FOUP 15, which is a container of the wafer W, is arranged in each of the loading/unloading cells 14. In addition to the loading/unloading cells 14, a temporary alignment cell (pre-aligner) 16 for aligning the wafer W before inspection and a plate storage cell (stocker) 17 for storing a plurality of polishing wafers 34 are also arranged in the loading/unloading region 12. In addition, a sub-chuck 18 for vacuum-attracting the wafer W at the time of aligning the wafer W is disposed in the pre-liner 16. Further, each of the polishing wafers 34 is stored in the stocker 17, with the polishing wafer 34 mounted on a polishing plate 35 to be described later.

A transfer arm mechanism 19 is arranged in the transfer region 13. Inside the transfer region 13, the transfer arm mechanism 19 transfers the wafer W before inspection, which is received from the FOUP 15 of the loading/unloading region 12. In addition, the transfer arm mechanism 19 places the wafer W before inspection on a chuck top 23 (to be described later) in the inspection region 11, receives the inspected wafer W from the chuck top 23, and transfers the same to the loading/unloading region 12.

A plurality of inspection parts (testers) 20 are arranged in the inspection region 11. The testers 20 are not partitioned from each other. The plurality of testers 20, each having a probe card 21, are arranged in a space constituting the inspection region 11.

Referring to FIG. 2, the inspection region 11 is divided into a plurality of floors, for example, three floors. The plurality of testers 20 are arranged on each floor. In addition, a transfer stage 22 configured to move between the testers 20, an aligning device (aligner), and an aligning camera (all not shown) are arranged in each floor.

The transfer stage 22 places the wafer W before inspection, which has been transferred to a boundary between the inspection region 11 and the transfer region 13 by the transfer arm mechanism 19, on the chuck top 23 placed on the transfer stage 22, and then moves the wafer W to face the probe card 21. Thereafter, the transfer stage 22 makes the wafer W and the chuck top 23 approach toward the probe card 21 to finally bring the wafer W into contact with the probe card 21. Each tester 20 inspects the electrical characteristics of a plurality of semiconductor devices on the wafer W that is in contact with the probe card 21. After the inspection of the electrical characteristics of the semiconductor devices is completed, the transfer stage 22 transfers the inspected wafer W and the chuck top 23 to the boundary between the inspection region 11 and the transfer region 13, and delivers the inspected wafer W to the transfer arm mechanism 19. Thereafter, the transfer arm mechanism 19 loads the inspected wafer W onto the FOUP 15 of the loading/unloading cell 14.

In the wafer inspection device 10, one wafer W is taken out of one FOUP 15 and is transferred to one tester 20 in cooperation between the transfer arm mechanism 19 and the transfer stage 22. While the inspection of the electrical characteristics of semiconductor devices of the respective wafer W in the single tester 20 is being performed, another wafer W may be taken out of another FOUP 15 and may be transferred to another tester 20. In addition, while the inspection of the electrical characteristics of the semiconductor devices of the respective wafer W in the respective tester 20 is being performed, another inspected wafer W may be taken out of another tester 20 and may be transferred to another FOUP 15 in cooperation between the transfer arm mechanism 19 and the transfer stage 22. That is to say, the wafers W may be sequentially transferred between the plurality of FOUPs 15 and the plurality of testers 20 in cooperation between the transfer arm mechanism 19 and the transfer stage 22. This allows efficient inspection of the electrical characteristics of the semiconductor devices of each wafer W.

Figure 3:
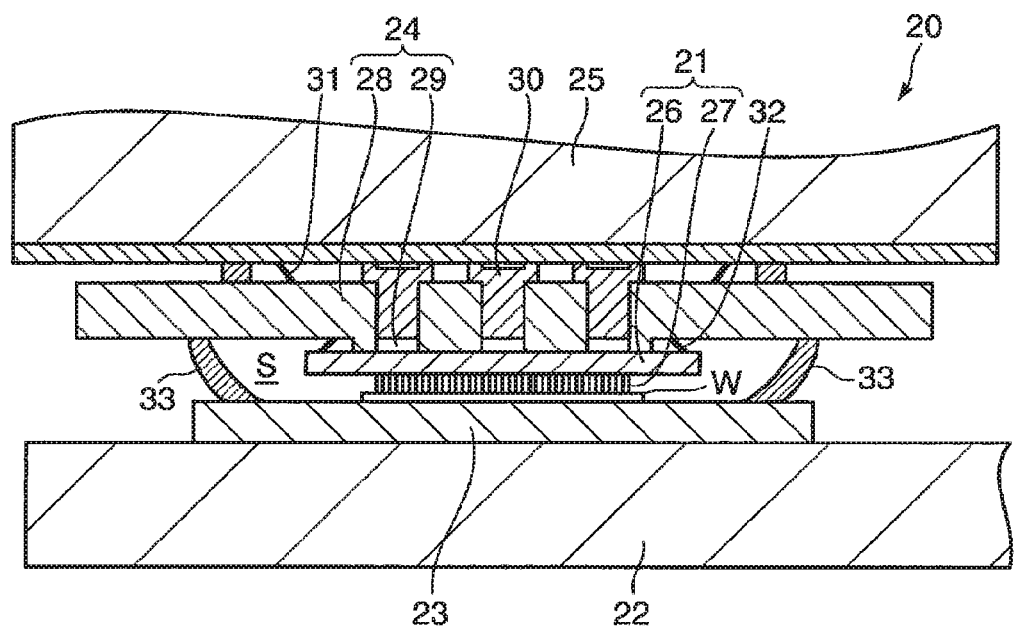
FIG. 3 is a sectional view schematically illustrating configurations of a transfer stage and a tester in FIGS. 1 and 2.

FIG. 3 is a sectional view schematically illustrating a configuration of the transfer stage and the tester in FIGS. 1 and 2. FIG. 3 shows a state in which the transfer stage 22 brings the wafer W into contact with the probe card 21 of the tester 20.

Referring to FIG. 3, the tester 20 includes the probe card 21, a pogo frame 24 as a plate-shaped base, and a base 25 for supporting the pogo frame 24 in a suspended state. The probe card 21 is attached to the lower side of the pogo frame 24.

The probe card 21 includes a disk-like main body 26, a number of electrodes (not shown) disposed substantially on the entire upper surface of the main body 26, and probes 27 which are a number of needle-shaped contact terminals arranged so as to protrude downward from the lower surface of the main body 26 in FIG. 3. The electrodes are connected to the respective probes 27. Each probe 27 is brought into contact with an electrode pad or a solder bump of each semiconductor device formed on the wafer W when the wafer W comes into contact with the probe card 21.

The pogo frame 24 includes a substantially flat plate-shaped main body 28 and a plurality of pogo block insertion holes 29 which are through-holes drilled in the vicinity of the central portion of the main body 28. A pogo block 30 in which a plurality of pogo pins are arranged is inserted into each of the pogo block insertion holes 29. The pogo block 30 is connected to an inspection circuit (not shown) of the tester 20 and is in contact with the number of electrodes formed on the upper surface of the main body 28 in the probe card 21 attached to the pogo frame 24. A current flows into each probe 27 of the probe card 21, which is connected to the respective electrode. The current flown from an electric circuit of the respective semiconductor device of the wafer W via the respective probe 27 is introduced into the inspection circuit.

In the tester 20, a space between the pogo frame 24 and the base 25 is sealed with a seal member 31. The pogo frame 24 is supported on the base 25 in a suspended state by evacuating the space. A space between the pogo frame 24 and the probe card 21 is also sealed with a seal member 32. The probe card 21 is attached to the pogo frame 24 by evacuating the space.

The transfer stage 22 is a flat plate-like member disposed below the tester 20. The transfer stage 22 places the chuck top 23 as a thick plate member thereon and holds the chuck top 23. The wafer W is placed and held on the upper surface of the chuck top 23. The chuck top 23 is vacuum-attracted onto the transfer stage 22 by suction ports (not shown) formed in the transfer stage 22. The wafer W is vacuum-attracted onto the chuck top 23 by suction ports (not shown) formed in the chuck top 23 (hereinafter referred to as "chuck top suction ports"). With this configuration, when the transfer stage 22 is moved, it is possible to prevent the chuck top 23 and the wafer W from being moved relative to the transfer stage 22. The holding of the chuck top 23 and the wafer W is not limited to the vacuum-attraction but may be any method as long as it can prevent the movement of the chuck top 23 and the wafer W relative to the transfer stage 22. As an example, the chuck top 23 and the wafer W may be held by electromagnetic attraction or clamping.

The transfer stage 22 is configured to be movable. Thus, the transfer stage 22 can move below the probe card 21 of the tester 20 so that the wafer W placed on the chuck top 23 faces the probe card 21. Further, the transfer stage 22 can move toward the tester 20 to bring the wafer W into contact with the probe card 21. The probe card 21 of the tester 20 and the chuck top 23 and the wafer W placed on the transfer stage 22 are arranged in a horizontal posture. Therefore, when the transfer stage 22 moves toward the tester 20, the wafer W is brought into even contact with each probe 27.

The upper surface of the chuck top 23, namely the surface facing the pogo frame 24, has a lip seal 33 as an elastic sealing member protruding toward the pogo frame 24. When the transfer stage 22 moves toward the tester 20 so that the wafer W is pressed against the probe card 21, the lip seal 33 is brought into contact with the lower surface of the main body 28 of the pogo frame 24. A space S, surrounded by the chuck top 23, the pogo frame 24 and the probe card 21, is formed when the wafer W is pressed against the probe card 21 and is hermetically sealed by the lip seal 33. When the space S is evacuated, the chuck top 23 is attracted to the pogo frame 24 to press the wafer W against the probe card 21. This makes it possible to keep each electrode pad and each solder bump of each semiconductor device on the wafer W in contact with each probe 27 of the probe card 21.

Figure 4:
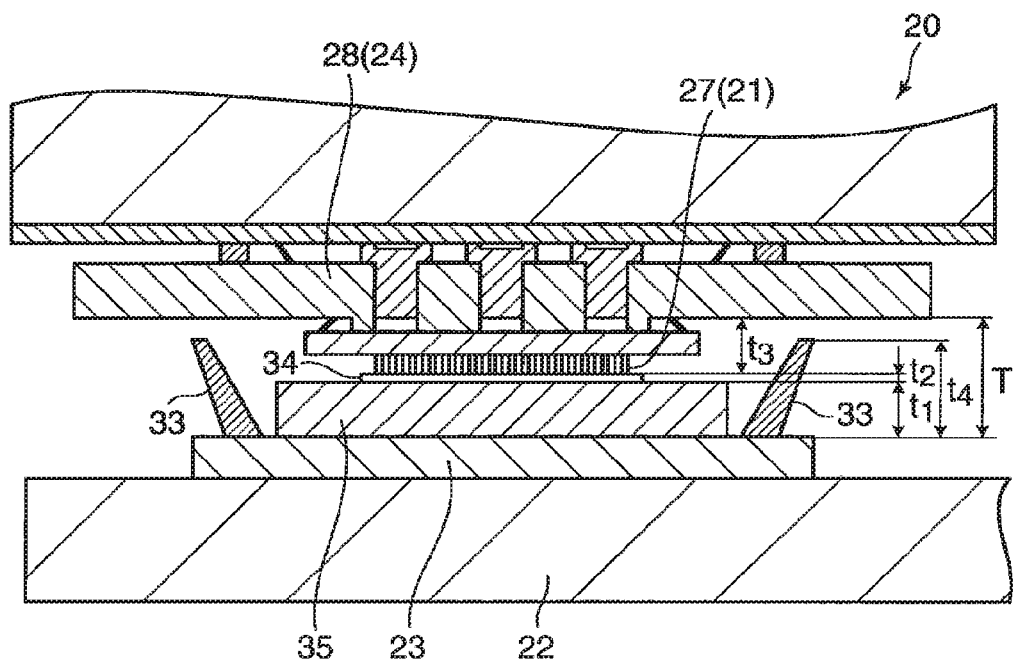
FIG. 4 is a sectional view of the transfer stage and the tester, explaining a state of polishing of each probe in FIG. 3.

FIG. 4 is a sectional view of the transfer stage and the tester for explaining a state when each probe shown in FIG. 3 is polished. FIG. 4 shows a state in which the transfer stage 22 brings a polishing wafer 34 into contact with each probe 27 of the probe card 21.

Referring to FIG. 4, a polishing plate 35 (raising member) formed of a substantially disk-like member is mounted on the upper surface of the chuck top 23. The polishing wafer 34 is mounted on an upper surface of the polishing plate 35. The upper surface and the lower surface of the polishing plate 35 are formed in parallel to each other. Thus, the upper surface of the polishing plate 35 mounted on the chuck top 23 disposed in a horizontal posture is also held in a horizontal posture. Accordingly, the polishing wafer 34 mounted on the upper surface of the polishing plate 35 is also held in a horizontal posture. As a result, when the transfer stage 22 moves toward the tester 20, the polishing wafer 34 is brought into even contact with each probe 27, thereby allowing each probe 27 to be uniformly polished.

In the present embodiment, a thickness of the polishing plate 35 is set at a value such that, when the transfer stage 22 moves toward the tester 20, before the lip seal 33 makes contact with the lower surface of the main body 28 of the pogo frame 24, the polishing wafer 34 mounted on the polishing plate 35 is brought into contact with each probe 27 of the probe card 21. Specifically, in the present embodiment, the total value T of a thickness $t_1$ of the polishing plate 35, a thickness $t_2$ of the polishing wafer 34 and a magnitude $t_3$ extending from the lower surface of the main body 28 of the pogo frame 24 to the lower end of each probe 27 of the probe card 21 is set to be larger than a magnitude $t_4$ of the lip seal 33 protruding from the upper surface of the chuck top 23. Thus, when the polishing wafer 34 makes contact with each probe 27, the lip seal 33 does not contact with the lower surface of the main body 28 of the pogo frame 24. As a result, the space S surrounded by the chuck top 23, the pogo frame 24 and the probe card 21 is not hermetically sealed by the lip seal 33, and the internal pressure of the space S does not increase.

In addition, in the present embodiment, the space S is formed as the lip seal 33 makes contact with the lower surface of the main body 28 of the pogo frame 24. Thus, the thickness of the polishing plate 35 is set at a value such that the polishing wafer 34 mounted on the polishing plate 35 is brought into contact with each probe 27 of the probe card 21 before the lip seal 33 makes contact with the lower surface of the main body 28 of the pogo frame 24. However, when the space S is formed as the lip seal 33 makes contact with the lower surface of the main body 26 of the probe card 21, the thickness of the polishing plate 35 is set at a value such that the polishing wafer 34 mounted on the polishing plate 35 is brought into contact with each probe 27 before the lip seal 33 makes contact with the lower surface of the main body 26 of the probe card 21. That is to say, the thickness of the polishing plate 35 may be any value as long as the polishing wafer 34 mounted on the polishing plate 35 can be brought into contact with each probe 27 before the space S is hermetically sealed by the lip seal 33.

Figure 5A:
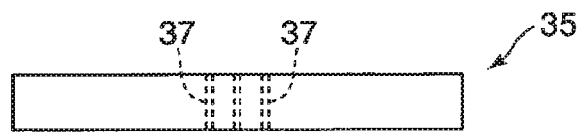
FIGS. 5A to 5C are a side view, a plan view and a bottom view, respectively, for explaining a configuration of a polishing plate in FIG. 4.
Figure 5B:
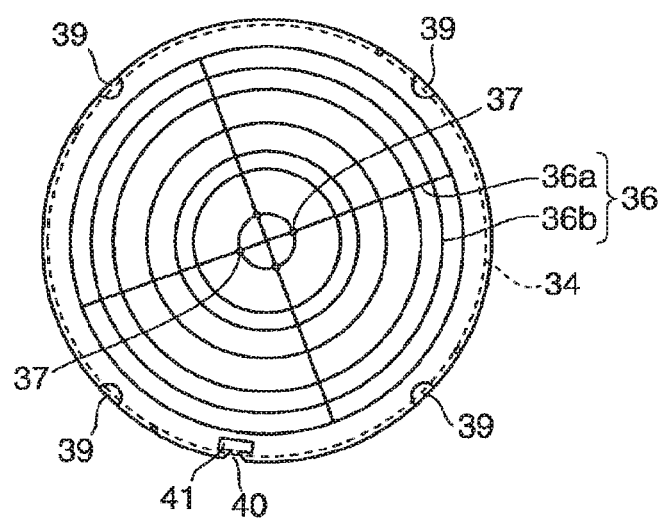
Figure 5C:
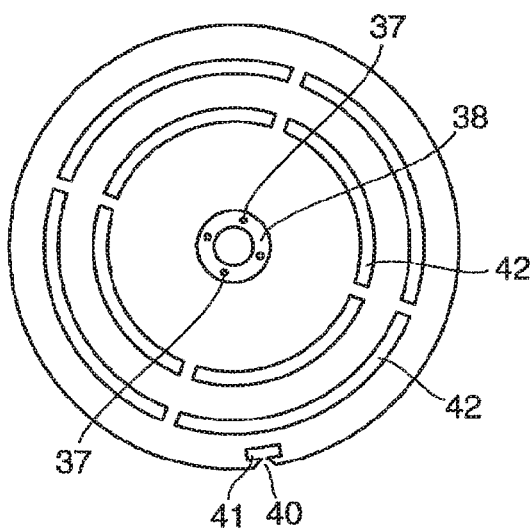

FIGS. 5A to 5C are a side view, a plan view and a bottom view for explaining a configuration of the polishing plate in FIG. 4, respectively.

Referring to FIGS. 5A to 5C, the polishing plate 35 has a plurality of suction grooves 36 formed in the upper surface of the polishing plate 35 on which the polishing wafer 34 is mounted. The suction groove 36 has a plurality of radial grooves 36a radially extending from the center of the polishing plate 35 toward the outer periphery thereof and a plurality of circumferential grooves 36b formed in a concentric relationship with the center of the polishing plate 35. The suction groove 36 is a groove having a section of several mm in both width and depth, and is in communication with through-holes 37 to be described later.

The polishing plate 35 has a plurality of through-holes (or communication holes) 37 penetrating the polishing plate 35 in the thickness direction. Each of the through-holes 37 is opened so as to face a chuck top suction port in the lower surface of the polishing plate 35. Accordingly, through the chuck top suction port, an interior of the suction groove 36 can be evacuated via each through-hole 37. Thus, the polishing wafer 34 mounted on the upper surface of the polishing plate 35 can be vacuum-attracted onto the polishing plate 35. In addition, when the polishing wafer 34 is vacuum-attracted onto the polishing plate 35, the polishing wafer 34 presses the polishing plate 35 toward the chuck top 23. Therefore, when the transfer stage 22 moves, it is possible to prevent the polishing plate 35 and the polishing wafer 34 from being moved relative to the chuck top 23. Further, a slightly wide suction groove 38 is formed in the lower surface of the polishing plate 35. Each through-hole 37 is opened in the suction groove 38. Therefore, even if each through-hole 37 is not opened so as to coincide with the chuck top suction port, it is possible for the chuck top suction port to vacuum-attract the polishing wafer 34 merely by facing the suction groove 38 toward the chuck top suction port.

Incidentally, in the wafer inspection device 10, the polishing wafer 34 is aligned while being mounted on the polishing plate 35 in the pre-liner 16. As such, the sub-chuck 18 needs to vacuum-attract the polishing wafer 34 and the polishing plate 35. The sub-chuck 18 is smaller than the chuck top 23 in size. Suction ports (hereinafter referred to as a "sub-chuck top suction ports") (not shown) are concentratively formed at the center of the sub-chuck 18. In this regard, in the polishing plate 35, the suction groove 38 in which the through-holes 37 are opened is formed in the vicinity of the center of the polishing plate 35, for example, within 38 mm from the center. As a result, the suction groove 38 can be disposed to face the sub-chuck top suction ports concentratively formed at the center of the sub-chuck 18. Thus, the polishing wafer 34 and the polishing plate 35 can be vacuum-attracted by the sub-chuck top suction ports.

The polishing plate 35 has a plurality of, e.g., four, recesses 39, formed in the outer periphery of the upper surface. Each recess 39 is partially covered with the polishing wafer 34. Therefore, by inserting a thin plate member such a spatula into each recess 39, it is possible to easily separate the polishing wafer 34 from the polishing plate 35.

In addition, the polishing plate 35 has an aligning notch 40 formed at a position corresponding to an aligning notch of the polishing wafer 34. The notch 40 penetrates the polishing plate 35 in the thickness direction. Thus, even when the polishing wafer 34 is mounted on the polishing plate 35, the notch of the polishing wafer 34 can be monitored from below. As a result, it is possible to align the polishing wafer 34 with the polishing wafer 34 mounted on the polishing plate 35 in the pre-liner 16 or the like. Further, the polishing plate 35 has an ID reading hole 41 formed to penetrate the polishing plate 35 in the thickness direction inside the notch 40. This makes it possible to read a wafer ID formed inside the notch of the polishing wafer 34 with the polishing wafer 34 mounted on the polishing plate 35, thereby simplifying a management process of the polishing wafer 34. In addition, in the polishing plate 35, both the notch 40 and the ID reading hole 41 are formed at one location. It is therefore possible to ensure the strength of the polishing plate 35 as compared with a case where they are formed to be separated from each other.

Further, the polishing plate 35 has a plurality of recesses 42 formed by counter boring or the like in the lower surface of the polishing plate 35. In addition, each recess 42 is arranged so as not to face the suction groove 36 formed in the upper surface of the polishing plate 35. As a result, it is possible to reduce the weight of the polishing plate 35 while ensuring the strength of the polishing plate 35.

The polishing wafer 34 is made of silicon. In a case of polishing each probe 27 with the polishing wafer 34 at a high temperature range, for example, around 85 degrees C., the polishing plate 35 may be made of aluminum because of its inexpensiveness, lightness and high workability. Aluminum has a large difference in thermal expansion from silicon depending on a temperature range. The polishing wafer 34 will not be displaced from the polishing plate 35 in the vicinity of 85 degrees C. due to such a thermal expansion difference. In addition, in a case of polishing each probe 27 not only in the high temperature range but also in a low temperature range, for example, around minus 30 degrees C., the polishing plate 35 may be made of silicon or silicon carbide. In particular, the silicon carbide has a coefficient of thermal expansion substantially equal to that of silicon in the entire temperature range. Therefore, regardless of the temperature at the time of polishing the polishing plate 35, it is possible to prevent the polishing wafer 34 from being displaced from the polishing plate 35 due to the thermal expansion difference.

FIGS. 6A to 6D are process diagrams illustrating a probe polishing method as a maintenance method of the wafer inspection device according to the embodiment.

Figure 6A:
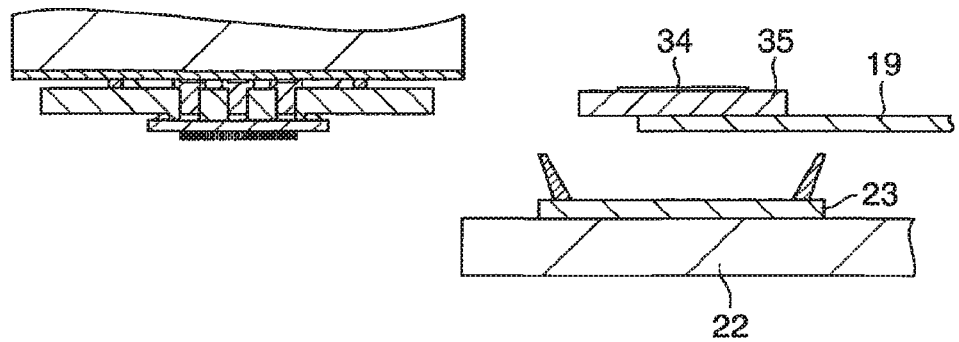
FIGS. 6A to 6D are process diagrams illustrating a probe polishing method as a maintenance method of the wafer inspection device according to an embodiment of the present disclosure.
Figure 6B:
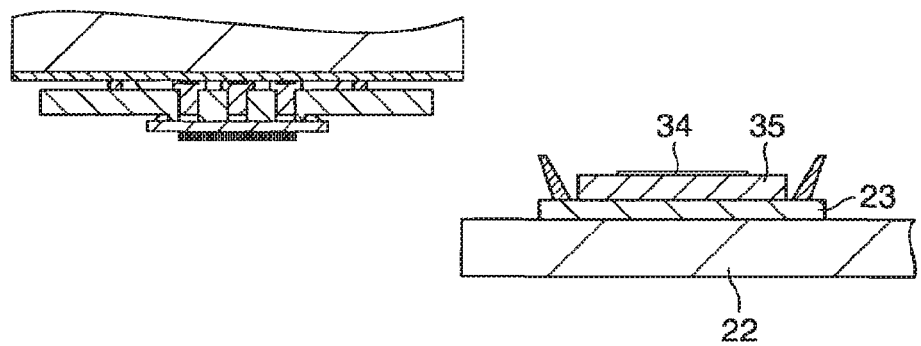

Referring to FIGS. 6A to 6D, first, the transfer arm mechanism 19 takes the polishing wafer 34 out of the stocker 17 in a state where the polishing wafer 34 is mounted on the polishing plate 35, transfers the polishing wafer 34 to the pre-liner 16 where the polishing wafer 34 is aligned, and then transfers the polishing wafer 34 to the boundary between the inspection region 11 and the transfer region 13 (see FIG. 6A). At this time, since the transfer arm mechanism 19 does not vacuum-attract the polishing wafer 34 and the polishing plate 35, the transfer arm mechanism 19 transfers the aligned polishing wafer 34 and the polishing plate 35 at a speed slower than the speed at which the wafer W is transferred, so that the aligned polishing wafer 34 is not displaced from the polishing plate 35.

Subsequently, the transfer stage 22 of one tester 20 places the polishing wafer 34 and the polishing plate 35, which are transferred by the transfer arm mechanism 19, on the chuck top 23 placed on the transfer stage 22. At this time, the chuck top 23 vacuum-attracts the polishing wafer 34 and the polishing plate 35 by the chuck top suction ports (see FIG. 6B).

Figure 6C:
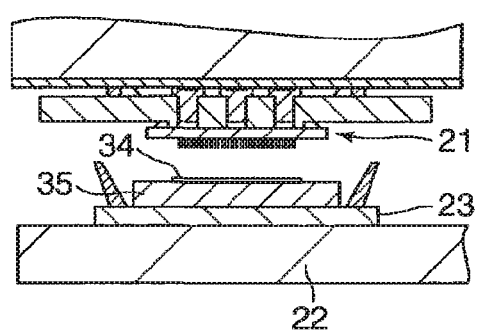
Figure 6D:
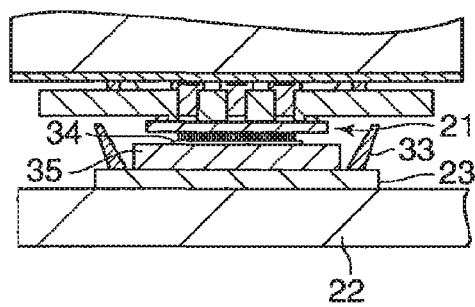
Figure 7A:
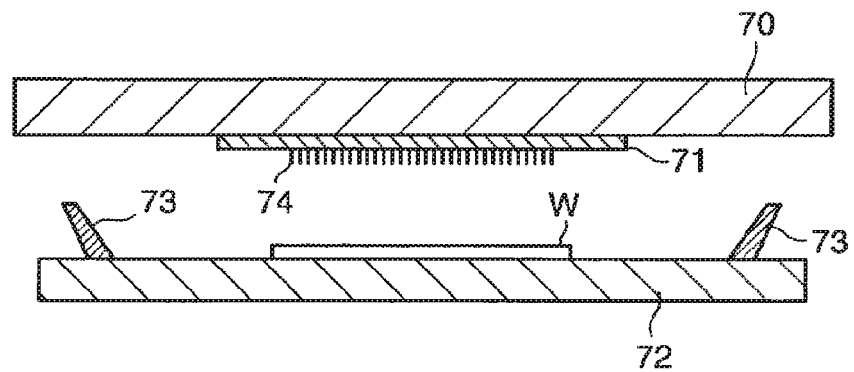
FIGS. 7A to 7C are process diagrams for explaining a state of contact between a wafer and a probe card on a prober in a conventional wafer inspection device.
Figure 7B:
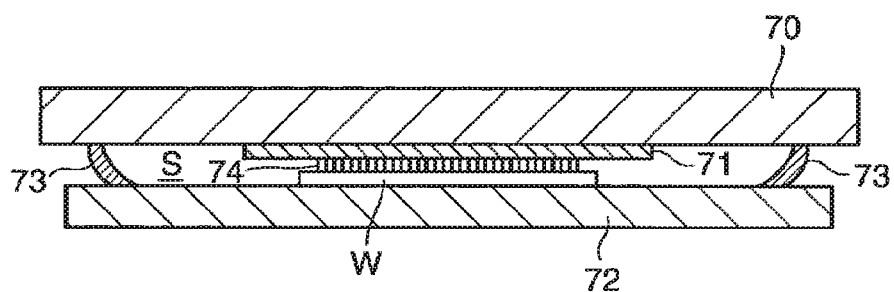
Figure 7C:
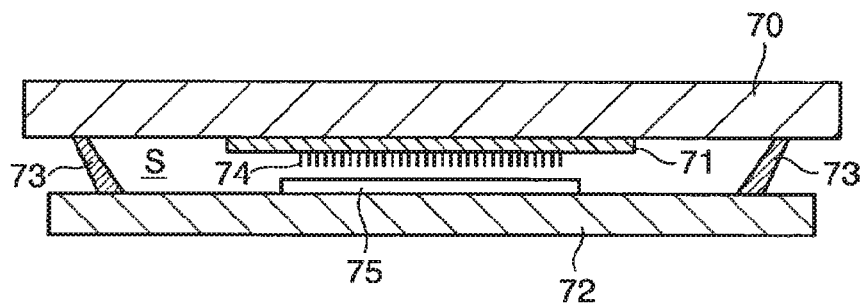

Subsequently, the transfer stage 22 moves horizontally to face the polishing plate 35 and the polishing wafer 34 placed on the chuck top 23 toward the probe card 21 (see FIG. 6C). Further, the transfer stage 22 moves upward to approach the polishing plate 35 and the polishing wafer 34 to the probe card 21 (see FIG. 6D). At this time, as described above, since the total value T of the thickness $t_1$ of the polishing plate 35, the thickness $t_2$ of the polishing wafer 34 and the magnitude $t_3$ extending from the lower surface of the main body 28 of the pogo frame 24 to the lower end of each probe 27 of the probe card 21 is set to be larger than the magnitude $t_4$ of the lip seal 33 protruding from the upper surface of the chuck top 23, the polishing wafer 34 is brought into contact with each probe 27 before the lip seal 33 makes contact with the lower surface of the main body 28 of the pogo frame 24. At this time, each probe 27 is polished by the polishing wafer 34.

Thereafter, the transfer stage 22 separates the polishing wafer 34 from the probe card 21, transfers the polishing wafer 34 and the polishing plate 35 to the boundary between the inspection region 11 and the transfer region 13, and delivers the polishing wafer 34 and the polishing plate 35 to the transfer arm mechanism 19. Thereafter, the transfer arm mechanism 19 carries the polishing wafer 34 and the polishing plate 35 into the stocker 17. In this way, the present method is terminated.

According to the present embodiment, when the transfer stage 22 moves toward the tester 20, the polishing plate 35 which is placed on the chuck top 23 and places the polishing wafer 34 thereon has a thickness such that the polishing wafer 34 is brought in contact with each probe 27 before the lip seal 33 seals the space S. Thus, the polishing wafer 34 is brought into contact with each probe 27 before the space S is hermetically sealed. That is to say, before the polishing wafer 34 is brought into contact with each probe 27, no repulsion force caused by the increase of the internal pressure of the space S is applied to the chuck top 23. Thus, it is possible to bring the polishing wafer 34 into proper contact with each probe 27. Further, since there is no need to take into consideration the decompression of the space S and the mitigation of the increase of the internal pressure of the space S, it is unnecessary to perform a decompression step or move the transfer stage 22 toward the tester 20 at a low speed, thereby preventing a reduction in throughput.

Further, in the present embodiment, the polishing plate 35 has a plurality of suction grooves 36 formed on the upper surface thereof. By evacuating the interiors of the suction grooves 36, the polishing wafer 34 is vacuum-attracted onto the polishing plate 35. That is to say, since the polishing wafer 34 is vacuum-attracted by the suction grooves 36, there is no need to evacuate a space between the upper surface of the polishing plate 35 and the polishing wafer 34 other than the suction grooves 36, thereby preventing a vacuum heat insulating layer from being formed. It is therefore possible to improve heat conductivity between the polishing wafer 34 and the polishing plate 35. This suppresses a difference in thermal expansion between the polishing wafer 34 and the polishing plate 35. As a result, it is possible to prevent the polishing wafer 34 from being displaced from the polishing plate 35.

Although the embodiments of the present disclosure have been described above, the present disclosure is not limited to the above embodiments.

This application is based upon and claims the benefit of priority from Japanese Patent Application No. 2015-246180, filed on Dec. 17, 2015, the entire contents of which are incorporated herein by reference.

EXPLANATION OF REFERENCE NUMERALS

S: space, W: wafer, 10: wafer inspection device, 21: probe card, 23: chuck top, 27: probe, 34: polishing wafer, 35: polishing plate, 37: through-hole

What is claimed is:

1. A wafer inspection device comprising:
   a probe card having a plurality of contact terminals formed to protrude toward an inspecting wafer;
   a chuck top as a thick plate member on which the inspecting wafer is mounted to face the probe card when inspecting the inspecting wafer;
   a seal member configured to seal a space between the probe card and the chuck top when the chuck top moves toward the probe card; and
   a polishing plate placed on the chuck top when polishing the plurality of contact terminals and configured to mount a polishing wafer thereon, the polishing wafer being configured to polish the plurality of contact terminals,
   wherein the polishing plate has a thickness such that, when the chuck top moves toward the probe card, the polishing wafer is brought into contact with each of the plurality of contact terminals before the space is sealed by the seal member.

2. The wafer inspection device of claim 1, wherein the chuck top includes a suction port for vacuum-attraction, and
   wherein the polishing plate includes a communication hole through which the suction port is brought into communication with the polishing wafer mounted on the polishing plate.

3. The wafer inspection device of claim 1, wherein the polishing plate is made of aluminum.

4. The wafer inspection device of claim 1, wherein the polishing plate is made of silicon or silicon carbide.

5. A maintenance method of maintaining a wafer inspection device, the maintenance method comprising:
   providing the wafer inspection device, the wafer inspection device comprising:
      a probe card having a plurality of contact terminals formed to protrude toward an inspecting wafer;
      a chuck top as a thick plate member on which the inspecting wafer is mounted to face the probe card when inspecting the inspecting wafer;
      a seal member configured to seal a space between the probe card and the chuck top when the chuck top moves toward the probe card; and
      a polishing plate placed on the chuck top when polishing the plurality of contact terminals and configured to mount a polishing wafer thereon, the polishing wafer being configured to polish the plurality of contact terminals, wherein the polishing plate has a thickness such that, when the chuck top moves toward the probe card, the polishing wafer is brought into contact with each of the plurality of contact terminals before the space is sealed by the seal member;

placing the polishing plate on the chuck top and mounting the polishing wafer; and moving the chuck top toward the probe card.

6. The maintenance method of claim 5, wherein the chuck top includes a suction port for vacuum-attraction, wherein the polishing plate includes a communication hole through which the suction port is brought into communication with the polishing wafer mounted on the polishing plate, and wherein, when the chuck top moves toward the probe card, the suction port attracts the polishing wafer via the communication hole.

\* \* \* \* \*